United States Patent
Kaspar et al.

(10) Patent No.: US 7,821,184 B2
(45) Date of Patent: Oct. 26, 2010

(54) CONTACTING MULTILAYER PIEZO ACTUATORS OR SENSORS

(75) Inventors: Michael Kaspar, Putzbrunn (DE); Erhard Magori, Feldkirchen (DE); Robert Weinke, München (DE)

(73) Assignee: Siemens Aktiengesellschaft, Munich (DE)

( * ) Notice: Subject to any disclaimer, the term of this patent is extended or adjusted under 35 U.S.C. 154(b) by 350 days.

(21) Appl. No.: 11/720,296

(22) PCT Filed: Nov. 11, 2005

(86) PCT No.: PCT/EP2005/055925

§ 371 (c)(1), (2), (4) Date: Nov. 12, 2007

(87) PCT Pub. No.: WO2006/058833

PCT Pub. Date: Jun. 8, 2006

(65) Prior Publication Data
US 2009/0179527 A1    Jul. 16, 2009

(30) Foreign Application Priority Data
Nov. 30, 2004    (DE) .................... 10 2004 057 795

(51) Int. Cl.
H01L 41/047 (2006.01)
H01L 41/083 (2006.01)

(52) U.S. Cl. .................................. 310/366
(58) Field of Classification Search ............ 310/328, 310/366
See application file for complete search history.

(56) References Cited

U.S. PATENT DOCUMENTS

| | | | |
|---|---|---|---|
| 5,155,409 A | 10/1992 | Swanson et al. | 310/366 |
| 5,252,883 A * | 10/1993 | Kondo | 310/328 |
| 5,289,074 A | 2/1994 | Mori | 310/328 |
| 5,920,972 A | 7/1999 | Palczewska et al. | 29/25.35 |
| 6,208,026 B1 | 3/2001 | Bindig et al. | 257/718 |
| 6,794,800 B1 * | 9/2004 | Heinz | 310/366 |
| 6,798,059 B1 * | 9/2004 | Ishihara et al. | 257/700 |
| 7,282,839 B2 * | 10/2007 | Mochizuki et al. | 310/366 |
| 7,385,337 B2 * | 6/2008 | Mochizuki et al. | 310/365 |
| 7,429,817 B2 * | 9/2008 | Asano et al. | 310/364 |
| 7,439,655 B2 * | 10/2008 | Asano et al. | 310/328 |
| 7,538,475 B2 * | 5/2009 | Ohmori et al. | 310/328 |
| 2001/0047796 A1 * | 12/2001 | Yamada et al. | 123/498 |
| 2002/0043901 A1 * | 4/2002 | Kihara et al. | 310/366 |
| 2004/0108792 A1 * | 6/2004 | Lubitz et al. | 310/366 |
| 2005/0269914 A1 * | 12/2005 | Berlemont | 310/366 |

FOREIGN PATENT DOCUMENTS
DE    31 50 696 A1    6/1983

(Continued)

OTHER PUBLICATIONS
International Search Report and Written Opinion for International Application No. PCT/EP2005/055925 (20 pages), Feb. 27, 2006.

Primary Examiner—Thomas M Dougherty
(74) Attorney, Agent, or Firm—King & Spalding, L.L.P.

(57) ABSTRACT

A device, especially a piezo stack (2) has a plurality of stacked actuator or sensor layers with electrodes (5) or piezo stack (2) contacts. A flexible lead frame (1) is electrically connected to the electrodes (5).

11 Claims, 2 Drawing Sheets

FOREIGN PATENT DOCUMENTS

| | | |
|---|---|---|
| DE | 33 08 277 A1 | 9/1984 |
| DE | 196 48 545 A1 | 5/1998 |
| EP | 1 132 978 A1 | 9/2001 |
| EP | 1 162 671 A2 | 12/2001 |
| JP | 62-211974 * 11/1987 | ................. 310/328 |

* cited by examiner

CONTACTING MULTILAYER PIEZO ACTUATORS OR SENSORS

CROSS-REFERENCE TO RELATED APPLICATIONS

This application is a U.S. national stage application of International Application No. PCT/EP2005/055925 filed Nov. 11, 2005, which designates the United States of America, and claims priority to German application number 10 2004 057 795.1 filed Nov. 30, 2004, the contents of which are hereby incorporated by reference in their entirety.

TECHNICAL FIELD

The present invention relates to a device or a piezo stack consisting of a plurality of actuator or sensor layers.

BACKGROUND

Conventionally piezo stacks consist of many individual actuator or sensor layers. The structure is comparable with ceramic capacitors. Initially, at one edge of the actuator/sensor in each case all electrodes of a pole are connected to each other by a printed metal strip. With a capacitor the connecting lead can now be soldered onto this contact. However, since the actuator/sensor changes its length, stress cracks occur in the contacted areas. This interrupts the contacting. For contacting of piezo stacks the contacting is therefore connected flexibly to the connecting leads at as many points as possible. To this end what is known as a wire harp consisting of many individual wires is soldered onto the stack electrodes and connecting lines. To insulate the wire harp and the actuator or sensor electrodes from each other the actuator/sensor is coated with insulation material. Subsequently the actuator/sensor is also packed into an elastic encapsulation to stabilize the connecting leads and to protect the wire harp.

The disadvantage is that the stress fractures in the contacting area caused by the changes in length of the actuator or sensor cannot be excluded completely.

SUMMARY

A reliable and low-cost contacting of piezo stack actuators (piezo stacks) can be provided. Piezos are to be electrically connected, especially in the case of actuators, securely to an electrical power supply device, and in the case of sensors securely to a signal detection device.

According to an embodiment, a device, in particular a piezo stack may comprise a plurality of actuator or sensor layers stacked on each other with electrodes or piezo stack contacting elements, wherein a flexible lead frame is electrically connected to the electrodes.

According to another embodiment, a method for electrical contacting of a device, e.g. a piezo stack consisting of a plurality of actuator or sensor layers with electrodes stacked on top of one another or piezo stack contacting elements, may comprise the steps of: creation of a lead frame adapted to the positions of the electrodes to be contacted, application of conductive connecting material to the electrodes to be contacted, positioning of the lead frame on the electrodes, activation of the connecting material, fixing of electrical supply leads to the lead frame, especially to a power supply or signal detection device.

BRIEF DESCRIPTION OF THE DRAWINGS

The present invention is explained in greater detail below using exemplary embodiments in conjunction with the figures. The figures show FIG. 1 a first exemplary embodiment of a device.

DETAILED DESCRIPTION

Figure 1:
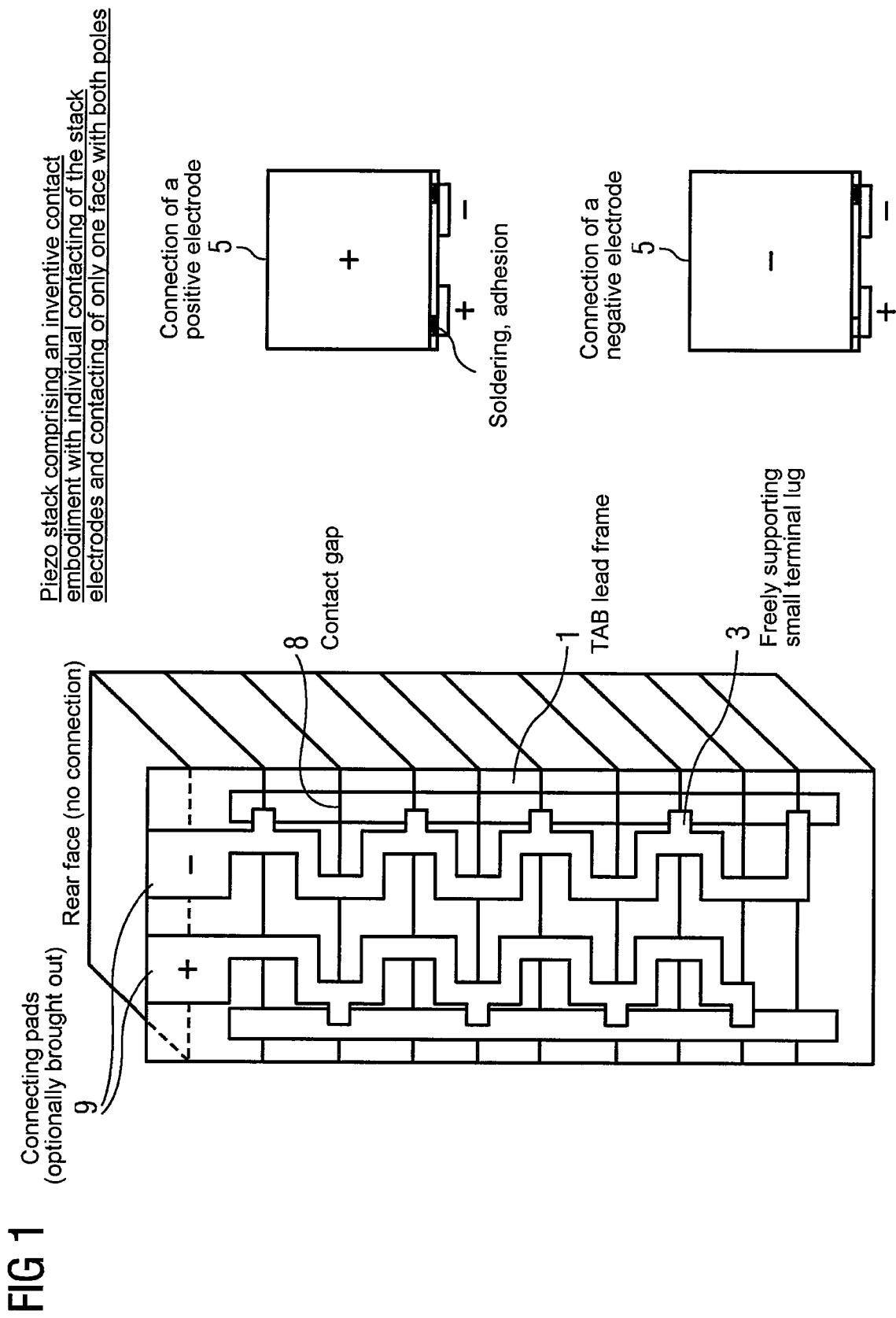
FIG. 1 shows a first exemplary embodiment, in which a lead frame 1 is positioned on a piezo stack 2.

The contacting is undertaken by a flexible lead frame with freely supporting or exposed terminals.

A piezo stack in this case consists of a plurality of actuator and sensor layers stacked on top of one another with electrodes, which are contacted by means of a flexible, especially TAB (tape-automated bonding) lead frame in the form of conductor structures on an insulating foil with freely supporting conductor structure areas via openings of the insulating foil. The electrodes of the piezo stack in this case are taken to mean the points of each piezo which are contacted with freely supporting conductor structures, especially by means of a connecting material. An electrode in this case adjoins either a positively or negatively polarized area of a piezo. Electrodes are piezo stack contacting elements.

This advantageous solution accordance to different embodiments creates a contacting of individual stack electrodes. In this way passive areas are avoided on the piezo surface and the efficiency is increased. In addition both poles can be contacted from one face (saves money/work steps).

In accordance with an advantageous embodiment all electrodes of the piezo stack are arranged on one face of the piezo stack.

In accordance with a further advantageous embodiment the piezos are stacked in such a manner that areas with the same polarity adjoin each other and a common electrode is arranged in the transitional area between them.

In accordance with a further advantageous embodiment each electrical pole is assigned a serpentine-shaped conductor structure, with said structures running in parallel to each other. This means that each piezo or each piezo layer is advantageously connected directly to the plus pole and the minus pole.

In accordance with a further advantageous embodiment the lead frame is fixed with its insulating foil face onto the piezo stack. This means that the conductor structures are electrically insulated in a simple manner from the piezos in the area outside the electrodes. The lead frame foil should be thin so that the distance between freely supporting areas of the conductor structures and the electrodes can be bridged more easily by connecting material.

Insulating foil is taken to mean foil that is completely electrically non-conducting.

In accordance with a further advantageous embodiment the lead frame is fixed with the conductor structure face to the piezo stack, with an additional insulation being embodied between the conductor structures and the piezos for avoidance of short circuits. This reduces the distance from the freely supporting areas of the conductor structures to the electrodes. I.e. conductive connecting material only has to bridge a relatively short distance.

In accordance with a further advantageous embodiment the conductor structures optionally feature pads brought out via the stack for the supply leads, especially to a power supply or signal detection facility.

In accordance with a further advantageous embodiment the conductor structures are contacted with electrodes and supply leads by means of conductive connection materials.

In a method for contacting piezo stacks, a flexible lead frame, especially a TAB lead frame, is created which has conductor structures on an insulating foil and which makes electrical connection with the freely-supporting areas of the conductor structures serving the electrodes via openings of the insulating foil, and of which the positions of the freely supporting areas are adapted to the positions of the electrodes to be contacted. This is followed by the application of connecting material, for example solder balls or solder paste, to the electrodes to be contacted, the positioning of the lead frame on the electrodes, the activation of the connecting material through soldering, for example hot bar soldering or reflow soldering. Finally electrical supply leads are fitted to the lead frame, especially leads to a power supply or signal detection facility.

In accordance with an advantageous embodiment the supporting conductor structures are provided with a solderable surface when the lead frame is created. This simplifies the contacting.

In accordance with an advantageous embodiment the connecting material is solder ball, solder paste, conductive adhesive and/or an ACA (anisotropic conductive adhesive).

In accordance with a further advantageous embodiment the connecting material is produced by means of soldering, e.g. hot bar soldering or reflow soldering.

In accordance with a further advantageous embodiment the electrical supply leads are fitted to the lead frame by means of welding, bonding, soldering, gluing with conductive adhesive, by terminals or direct connectors.

In accordance with a further advantageous embodiment additional insulation is created on the conductor structure face of the lead frame and/or on the face of the piezo stack featuring the electrodes. This is especially required if the lead frame is fitted with its conductor structure face towards the electrode face of the stack.

In accordance with a further advantageous embodiment, outer insulation, vibration protection and/or a strain relief is additionally created by means of dip lacquering, spray lacquering, (vacuum) molding or injection molding. Strain reliefs are used for example to safeguard the electrical connection of supply leads and conductor structures.

Advantages of the present embodiments:
The fitting of the printed metal strip can be dispensed with.
The method allows a high degree of design freedom.
The insulation of the stack is essentially thinner (depending on the TAB foil used).
The heat dissipation is improved.
The method is process-safe.
A majority of the method is undertaken automatically in the roll-to-roll process.
The stability can be increased by the design freedom:
  Definition of desired fracture points or
  stress-optimized fracture-free design
Individual electrodes can be contacted by avoiding passive areas in the stack. Stress fractures are thus excluded by passive areas. The electrodes of the stack do not need to be manufactured as structured electrodes.
Higher efficiency, since the entire actuator surface is active and passive areas can be dispensed with.

The method makes possible the contacting of both poles on one face. This removes process costs for two-sided processing.
All processes are suitable for large-scale series production.
The dielectric strength and reliability are increased and more precisely defined.
The improved characteristics make it possible to use smaller stacks and thus save money.

The flexible lead frame 1 features conductor structures 4 on an insulating foil 6 and is connected electrically to electrodes 5 of the piezo stack 2 via freely supporting or exposed areas 3 of the conductor structures 4 created via openings 8 of the insulating foil. The conductor structures 4 are planar conductor tracks here. Openings 8 are strips cut out of the insulating foil 6. These channels lie parallel to one another and are produced by the positions of the electrodes 5 of the piezo stack 2. Other forms of openings 8 are also possible. The serpentine shape of the conductor tracks serves to contact the conductor tracks in the optimum manner with good insulation and is adapted to the piezo thickness (for example the piezo thickness is around 50 to 100 um). Copper or aluminum is for example suitable as semiconductor material. The insulating foil 6 consists of a polymer for example.

The following layout steps can first be performed:
1. Constructing a TAB lead frame 1 with alternating freely supporting small terminal legs or freely supporting areas 3 of the conductor structure 4 in the grid of the piezo stack 2. Optionally the small supporting legs 3 (or also referred to as small supporting lugs 3) can be provided with a solderable surface.
2. Application of solder balls or solder paste to the piezo stack contacting elements or electrodes 5.
3. Positioning of the lead frame 1 and soldering by hot bar soldering or reflow soldering for example.

The lead frame 1 can be positioned in two ways. In accordance with the first exemplary embodiment depicted in FIG. 1, the lead frame 1 is positioned with the supporting legs 3 on the side facing away from the stack 2. The lead frame lies with its insulating foil 6 on the face of the stack 2 featuring the electrodes 5. In accordance with this exemplary embodiment a lead frame foil 6 which is as thin as possible is required, in order to keep the distance from the supporting legs 3 to the stack 2 small. This distance must be bridged via a corresponding height of conductive connection material (solder ball, solder paste, conductive adhesive, ACA etc.). The conductor structures 4 are insulated from the stack via the support material, i.e. the insulating foil 6, of the lead frame 1.

Figure 2:
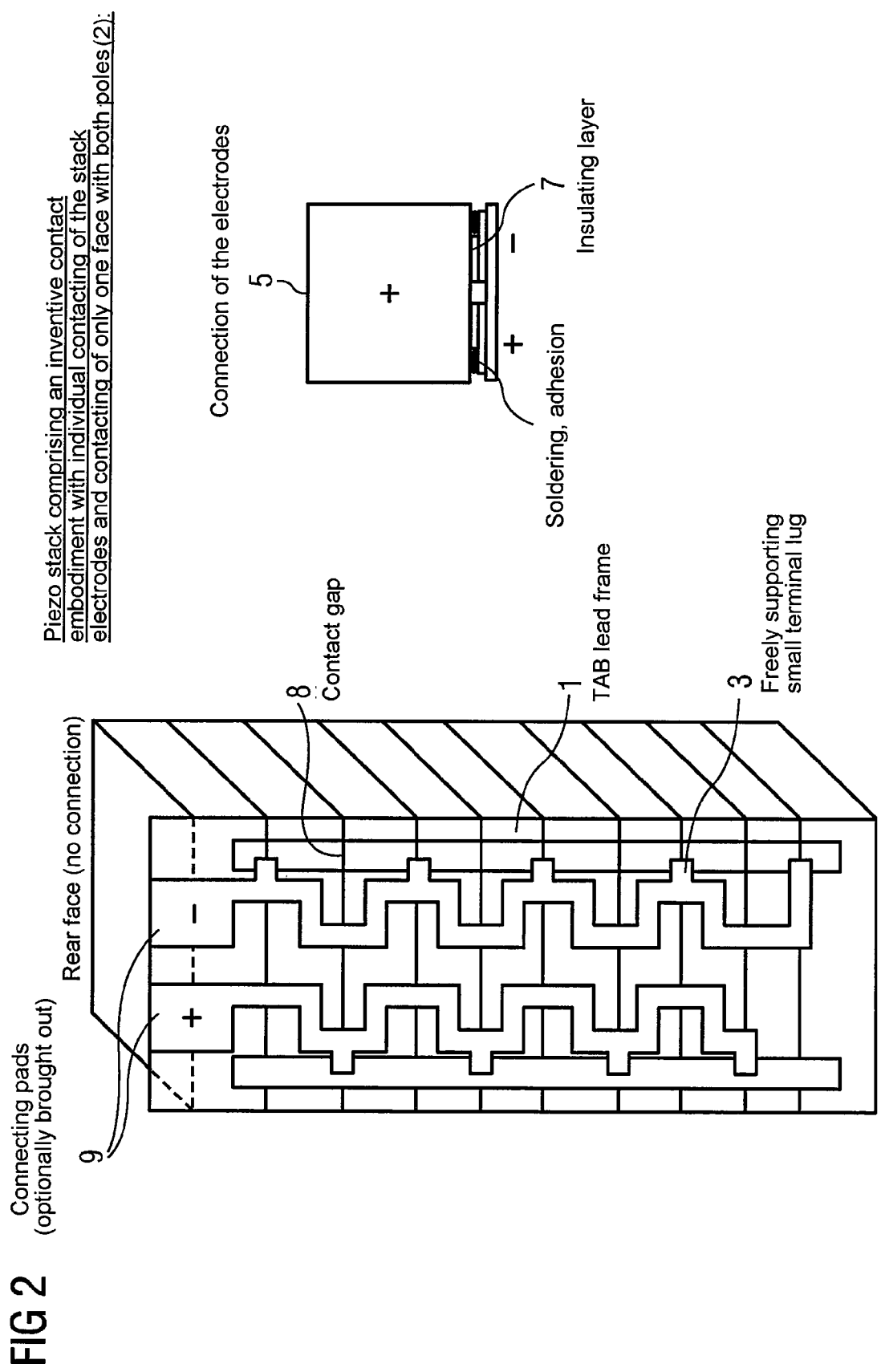
FIG. 2 a second exemplary embodiment of a device.

In accordance with a second exemplary embodiment depicted in FIG. 2, the lead frame 2 is positioned with the supporting legs 3 on the side facing towards the stack 2. I.e. the lead frame 1 lies with its conductor structures 4 face on the side of the piezo stack 2 featuring the electrodes 5. Insulation 7 of the conductor structures 4 is required to avoid a short circuit between the poles. This insulation 7 can be applied during the lead frame process or the piezo stack 2 can have the insulation 7. The connection is established again via a conductive connecting material (solder ball, solder paste, conductive adhesive). Alternatively the insulation and simultaneous contacting can be undertaken using an ACA (anisotropic conductive adhesive) adhesion.

The application of any necessary supply leads, for example by welding, bonding, soldering gluing with conductive adhesive, terminals or direct connectors is undertaken as the 4th and last layout step. An external insulation, vibration protection and/or a strain relief is additionally created by means of a suitable method (dip lacquering, spray lacquering, (vacuum) molding or injection molding etc.). This method step, like method steps 1 and 2, is executed in the same way in both exemplary embodiments.

In accordance with the two exemplary embodiments the conductor structures 4 follow a serpentine-shaped path and run in parallel to each other.

Other embodiments in respect of the design of the lead frames 1 are likewise included in the area of protection of this application.

The method for creating the devices according to FIG. 1 and FIG. 2 also falls within the area of protection.

What is claimed is:

1. A device comprising:
   a piezo stack including a plurality of actuator or sensor layers stacked on each other with electrodes or piezo stack contacting elements; and
   a lead frame including:
   a layer of insulating foil arranged over a first side of the piezo stack, the insulating foil layer including one or more foil layer openings; and
   at least one serpentine-shaped conductor structure arranged generally over the insulating foil layer, each serpentine-shaped conductor structure including a serpentine-shaped portion and a plurality of tabs extending laterally from the serpentine-shaped portion, the plurality of tabs being conductively coupled to the electrodes of the piezo stack through one of the foil layer openings at a plurality of locations along the axial length of the piezo stack.

2. The device according to claim 1, wherein all electrodes are arranged on one face of the piezo stack.

3. The device according to claim 1, wherein the piezo stack is stacked in such a manner that areas of the same polarity lie against each other and a common electrode is arranged in a transitional area between areas of the same polarity.

4. The device according to claim 1, wherein each electrical pole is assigned a serpentine-shaped conductor structure, with said structures running in parallel to each other.

5. The device according to claim 1, wherein the insulating foil layer is affixed directly onto the piezo stack.

6. The device according to claim 1, wherein the lead frame is fixed with the conductor structures onto the piezo stack and an insulation is embodied between the at least one conductor structures and the piezo stack.

7. The device according to claim 1, wherein each conductor structure includes at least one feature pad brought out via the piezo stack for a supply lead to a power supply or to a signal detection unit.

8. The device according to claim 1, wherein the each conductor structure is contacted with electrodes and a supply lead by means of conducting connection materials.

9. A piezo stack comprising a plurality of actuator or sensor layers stacked on each other with electrodes or piezo stack contacting elements, and a flexible lead frame electrically connected to the electrodes, the flexible lead frame including:
   a layer of insulating foil arranged over a first side of the piezo stack, the insulating foil layer including one or more foil layer openings; and
   at least one serpentine-shaped conductor structure arranged generally over the insulating foil layer, each serpentine-shaped conductor structure including a serpentine-shaped portion and a plurality of tabs extending laterally from the serpentine-shaped portion and over one of the foil layer openings, the plurality of tabs being conductively coupled to the electrodes of the piezo stack through the foil layer opening at a plurality of locations along the axial length of the piezo stack.

10. The piezo stack according to claim 9, wherein all electrodes are arranged on one face of the piezo stack.

11. The piezo stack according to claim 9, wherein the piezo stack is stacked in such a manner that areas of the same polarity lie against each other and a common electrode is arranged in a transitional area between areas of the same polarity.

* * * * *